(12) United States Patent
Parris et al.

(10) Patent No.: US 7,002,874 B1
(45) Date of Patent: Feb. 21, 2006

(54) DUAL WORD LINE MODE FOR DRAMS

(75) Inventors: Michael C. Parris, Colorado Springs, CO (US); Douglas Blaine Butler, Colorado Springs, CO (US); Oscar Frederick Jones, Jr., Colorado Springs, CO (US)

(73) Assignees: United Memories, Inc., Colorado Springs, CO (US); Sony Corporation, Tokyo (JP)

( * ) Notice: Subject to any disclaimer, the term of this patent is extended or adjusted under 35 U.S.C. 154(b) by 0 days.

(21) Appl. No.: 11/081,191

(22) Filed: Mar. 16, 2005

(51) Int. Cl.
*G11C 8/10* (2006.01)
(52) U.S. Cl. .................. 365/230.06; 365/187; 365/188
(58) Field of Classification Search .......... 365/230.06, 365/187, 188, 186
See application file for complete search history.

(56) References Cited

U.S. PATENT DOCUMENTS

| | | | | |
|---|---|---|---|---|
| 5,574,879 A | * | 11/1996 | Wells et al. ................. | 711/100 |
| 5,671,388 A | * | 9/1997 | Hasbun ...................... | 711/103 |
| 6,452,855 B1 | | 9/2002 | Hsu et al. .............. | 365/230.03 |
| 6,867,994 B1 | * | 3/2005 | Tsukikawa ................... | 365/72 |

* cited by examiner

*Primary Examiner*—Andrew Q. Tran
(74) *Attorney, Agent, or Firm*—Peter J. Meza; William J. Kubida; Hogan & Hartson LLP

(57) ABSTRACT

An integrated circuit memory includes circuitry for individually activating word lines in a first one memory cell per bit operational mode, simultaneously activating at least two word lines in a second operational mode where two or more memory cells are dedicated to each data bit, and providing a word line sequence when first converting stored data in the array of memory cells from the first operational mode to the second operational mode. The word line sequence includes activating a first word line, developing a valid signal on a corresponding bit line, and then activating a second word line while the first word line is still active.

20 Claims, 5 Drawing Sheets

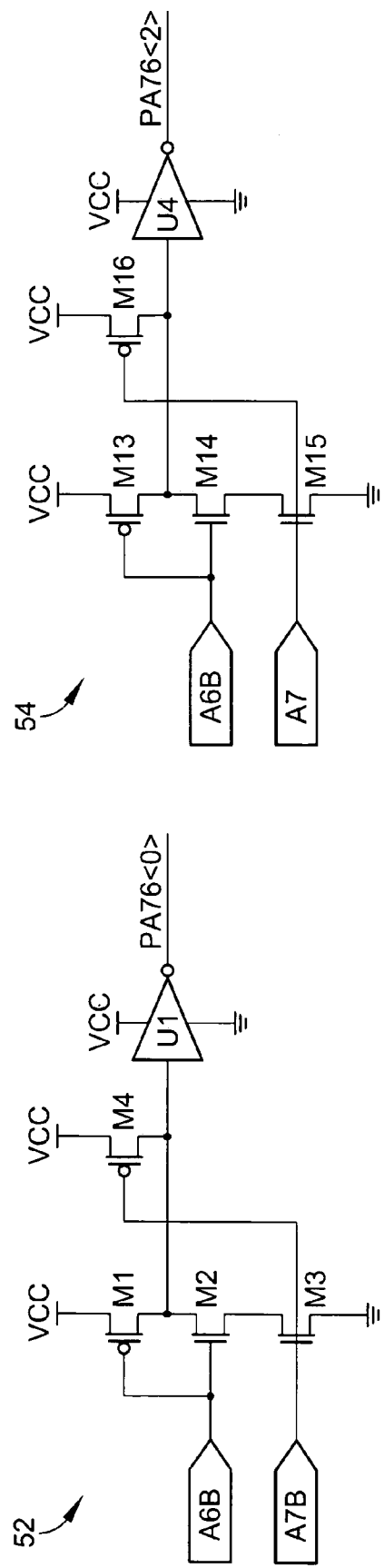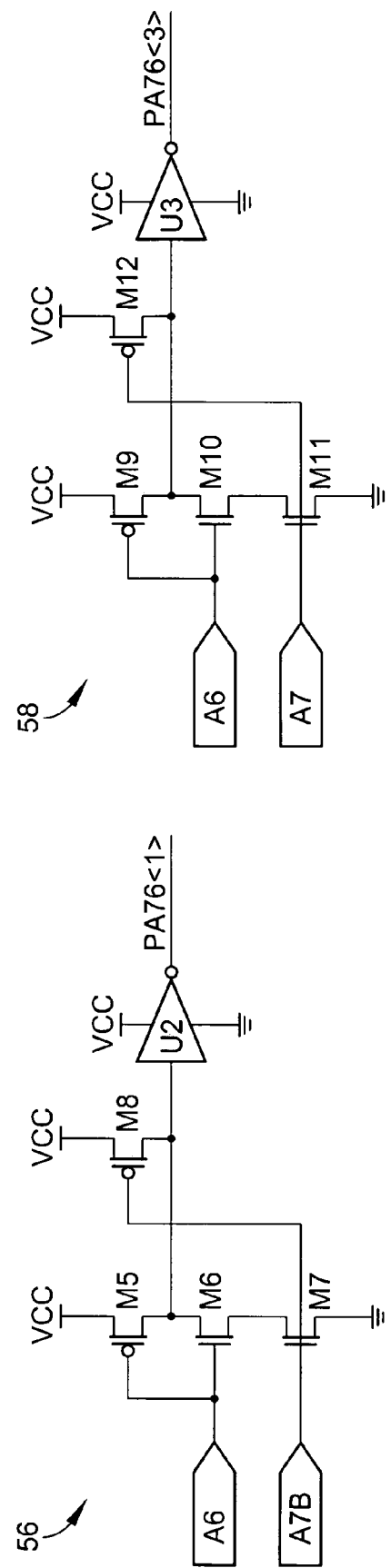
Fig. 5
Prior Art

DUAL WORD LINE MODE FOR DRAMS

BACKGROUND OF THE INVENTION

The present invention relates, in general, to the field of integrated circuit memories. More particularly, the present invention relates to a method and apparatus for operating an integrated circuit memory array in a first, single memory cell per bit operational mode and in a second, two or multi-memory cell per bit operational mode.

A typical "1T/1C" memory cell 10 that forms part of an array of such cells for a typical DRAM integrated circuit memory is shown in FIG. 1. Memory cell 10 includes an access transistor M1 for reading data from or writing data to storage capacitor C1. A source/drain of transistor M1 is coupled to the bit line BL, and the gate of transistor M1 is coupled to the word line WL. Only one memory cell, word line, and bit line is shown, although it is apparent to those skilled in the art that there are a plurality of word lines, bit lines, and memory cells arranged in rows and columns in a typical DRAM memory array. An array of 1T/1C memory cells of the type shown in FIG. 1 is preferred since these cells provide a single data bit for the smallest amount of integrated circuit die area.

A "2T/2C" memory cell 20 that forms part of an array of such cells for a DRAM integrated circuit memory is shown in FIG. 2. Memory cell 20 includes two access transistor M1 and M2 for reading data from or writing data to storage capacitors C1 and C2. A source/drain of transistor M1 is coupled to the bit line BL, and the gate of transistor M1 is coupled to a first word line WL1. A source/drain of transistor M2 is coupled to the complementary bit line/BL, and the gate of transistor M2 is coupled to the word line WL2. Only two memory cells, two word lines, and two bit lines are shown, although it is apparent to those skilled in the art that there are a plurality of word lines, bit lines, and memory cells arranged in rows and columns in a 2T/2C DRAM memory array. An array of 2T/2C memory cells of the type shown in FIG. 2 is not preferred in most cases since these cells provide a single data bit for double the amount of integrated circuit die area compared to a 1T/1C array. There are some cases, however, in which the lower density but greater signal strength and other concomitant advantages of a 2T/2C memory are desired.

Prior art techniques have been developed for operating an array of memory cells as both an array of 1T/1C memory cells in a first operational mode and an array of 2T/2C memory cells in a second operational mode. One prior art technique teaches a method of adding extra pass gates to the edges of the DRAM subarray that changes which bit lines are compared by the sense amplifiers for a normal operating mode and for the twin-cell operating mode. While such a technique can provide both operational modes, it can be difficult to go between the regular mode and the twin cell mode. Also, extra switching devices not normally used in the memory array are required at the array edge. These extra devices are not symmetrical on the BL and/BL bit lines and cause capacitance imbalances. Also, the gates of these devices need to be switched in an AC manner and reduce chip speed and increase chip power. Prior art techniques such as the one described above cannot be extended to four or more cells per bit and are limited to either one or two cells per bit.

What is desired is a method of operating an integrated circuit memory array that easily switches between a single memory cell per bit operating mode to a two or more memory cell per bit operating mode, without the capacitor imbalance, complicated circuitry, or other restrictions found in prior art techniques.

SUMMARY OF THE INVENTION

According to an embodiment of the present invention a method of operating an integrated circuit memory including an array of memory cells each coupled to a bit line and a word line includes individually activating the word lines in a first one memory cell per bit operational mode, simultaneously activating at least two word lines in a second operational mode where two or more memory cells are dedicated to each data bit, and providing a word line sequence when first converting stored data in the array of memory cells from the first operational mode to the second operational mode. The word line sequence includes activating a first word line, developing a valid signal on a corresponding bit line, and then activating a second word line while the first word line is still active.

The second operational mode can be extended to two, four, eight, or more memory cells per data bit. The method of the present invention can also be extended to the testing of memories. Under-performing higher density memories can be re-branded as acceptable lower density memories by permanently forcing the integrated circuit memory to remain in the second operational mode.

According to an embodiment of the present invention, a predecoder for an integrated circuit memory for switching between the first operational mode and the second operational mode includes an input section having first and second address inputs and an output section coupled to the input section having a control signal input and an output for providing an output signal, wherein the output signal is responsive to the data states of the first and second address inputs in the first operational mode, and the output signal is forced to a data state in response to a control signal on the control signal input in the second operational mode.

The input section of the predecoder includes first, second, third, and fourth cascode-coupled transistors, wherein the gate of the first transistor receives a first address signal, the gate of the second transistor receives a second address signal, the gate of the third transistor receives the second address signal, and the gate of the fourth transistor receives the control signal.

The output section of the predecoder includes first and second cascode-coupled transistors, wherein the gate of the first transistor receives the control signal, and the gate of the second transistor receives a first address signal.

In the second operational mode, the integrated circuit memory array has an increased cell capacitance of at least a factor of two per memory cell, with at least double the available sensing signal. Further, in the second operational mode there is a longer time between refreshes due to the increased memory cell capacitance, and therefore lower power is required.

The first and second operational modes of the present invention can be programmed in and out by setting a register or by fuse selection. A register can be set for temporary entry into the second operational mode, and fuse blowing is used for a permanent setting of the second operational mode.

The present invention can be used with current industry standard mobile DRAM memories. Several different industry standard mode register set are available in which a "self refresh" or "sleep" mode is required. The first and second operational modes of the present invention can accommodate both the "normal" mode of operation and also the "self refresh" or "sleep" modes of operation.

The method of the present invention can be extended to four, eight, or even more cells per bit. Refresh times are also extended when adding more cells per bit in the second operational mode.

Special word line sequencing is used when first converting stored data from the first operational mode to the second operational mode. This allows single cell data to be maintained without any external writes.

Non-boosted word lines can be employed with the second operational mode. Since complementary data is stored one bit will always be a zero, which saves power.

In the method and apparatus of the present invention transistor overlap coupling is cancelled out as with dummy word line techniques in the prior art.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIG. 5 is a schematic diagram of four word line predecoders each having an output that is a logic function of two address inputs;

DETAILED DESCRIPTION

Figure 1:
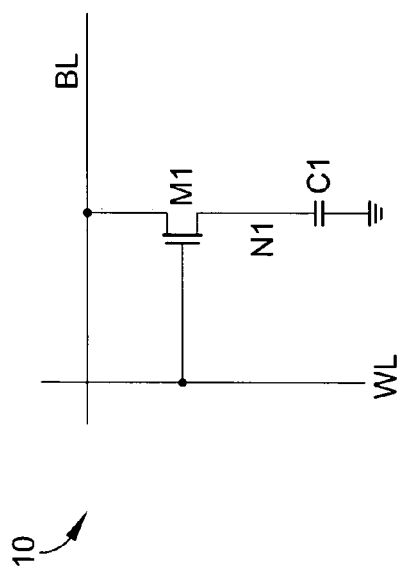
FIG. 1 is a schematic diagram of a prior art 1T/1C DRAM memory cell.
Figure 2:
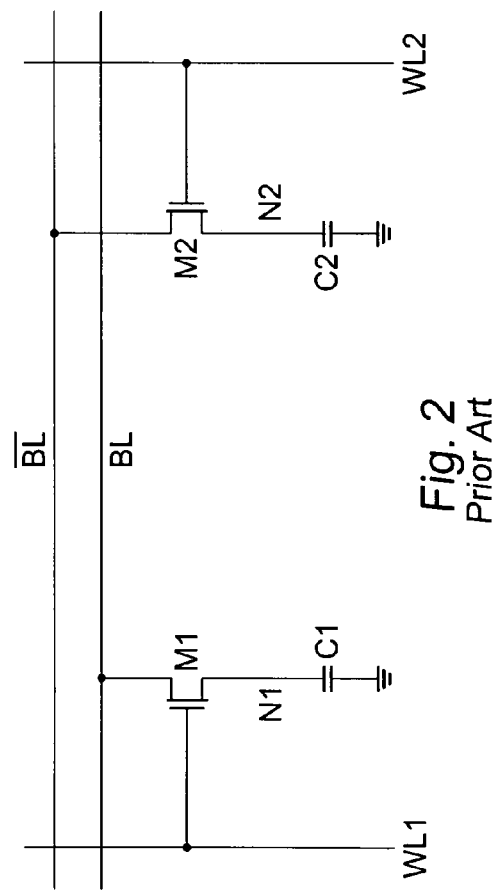
FIG. 2 is a schematic diagram of a prior art 2T/2C DRAM memory cell.
Figure 3:
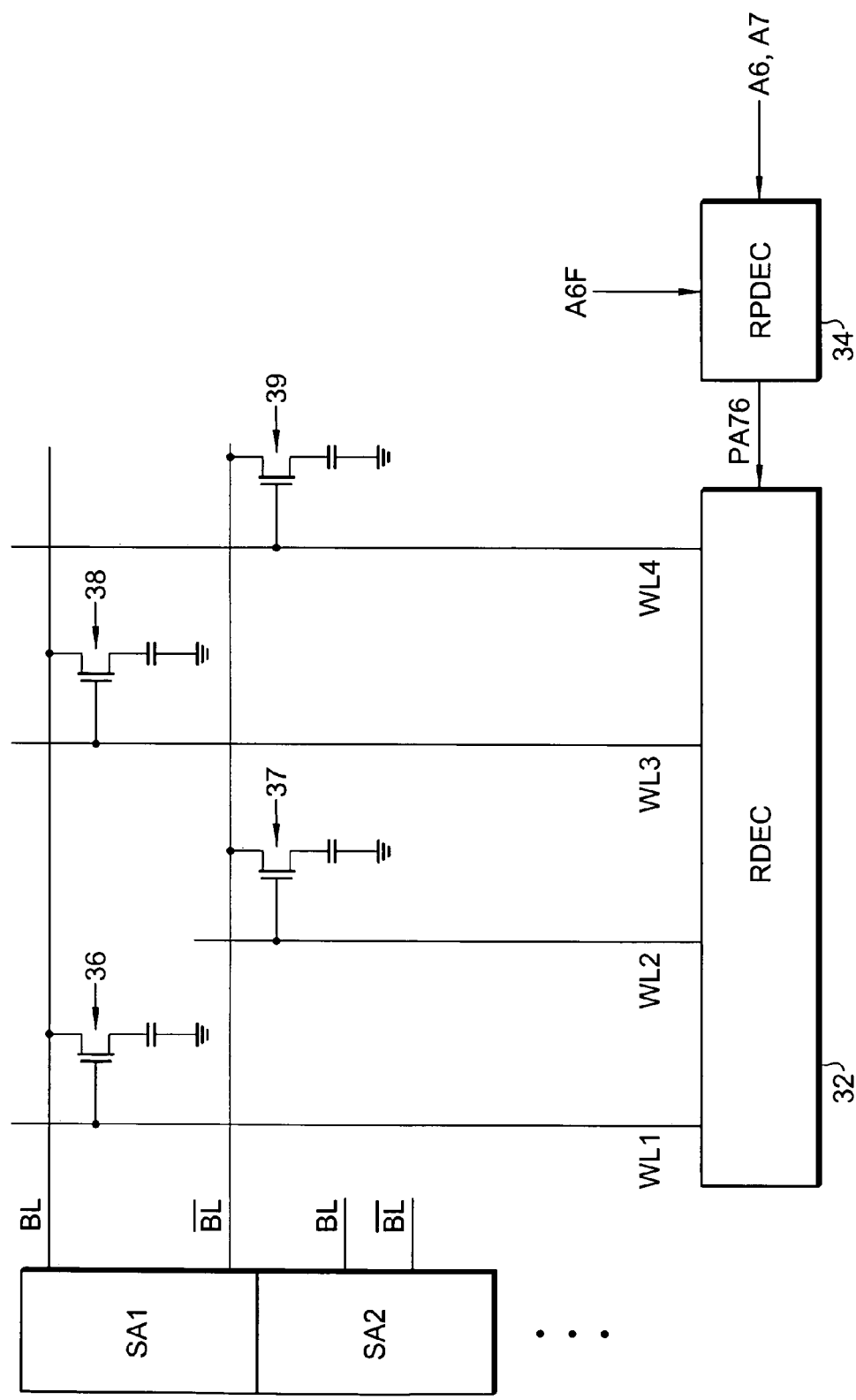
FIG. 3 is a schematic diagram of a portion of an integrated circuit memory according to the present capable of easily switching between a first operational mode having one memory cell per bit and a second operational mode having two or more memory cells per bit.

Referring now to FIG. 3 a portion 30 of an integrated circuit DRAM memory array and supporting circuitry is shown for easily switching between the first operational mode to the second operational mode according to the present invention. In going from the normal, first operating mode to the twin cell mode or four bits per one data bit second operating mode the overall density of the DRAM memory is reduced by one-half or one-fourth.

In FIG. 3, a column of sense amplifiers is shown including sense amplifiers SA1 and SA2. Other sense amplifiers are present in the column according to the number of bit lines in the memory array as is known in the art. Bit line BL is coupled to memory cells 36 and 38, as well as many other memory cells (not shown) in a typical memory array. Complementary bit line /BL is coupled to memory cells 37 and 39, as well as many other memory cells (not shown) in a typical memory array. Word line WL1 is coupled to memory cell 36, as well as other memory cells that are not shown in FIG. 3. Word line WL2 is coupled to memory cell 37, as well as other memory cells that are not shown in FIG. 3. Word lines WL1 and WL2, as well as word lines WL3 and WL4 are driven by a standard row decoder 32 that receives address data PA76 from row predecoder 34. Row predecoder 34 receives address data A6, A7, as well as a control signal A6F. Addresses A6 and A7 are used to control word lines WL1–WL4 in a normal first operational mode, and the control signal A6F is used to force the output of predecoder 34 in the multiple cell per bit second operational mode such that word lines WL1–WL4 are operated together as is explained in further detail below. Additional row decoders and row predecoders according to the present invention are used to control other word lines in the array (not shown in FIG. 3). A row decoder having two, four, eight, sixteen, or more outputs can be driven by a row predecoder according to the present invention as is also explained in further detail below.

FIG. 5 shows four standard address predecoders 52, 54, 56, and 58 that are used to drive a row decoder, which in turn drives one of four word lines at a time. Predecoders 52, 54, 56, and 58 include a NAND gate, an inverter, and address inputs. The NAND gate for predecoder 52 includes transistors M1, M2, M3, and M4. The inverter is U1, and the address inputs are A6B and A7B. The NAND gate for predecoder 54 includes transistors M13, M14, M15, and M16. The inverter is U4, and the address inputs are A6B and A7. The NAND gate for predecoder 56 includes transistors M5, M6, M7, and M8. The inverter is U2, and the address inputs are A6 and A7B. The NAND gate for predecoder 58 includes transistors M9, M10, M11, and M12. The inverter is U3, and the address inputs are A6 and A7.

Figure 6:
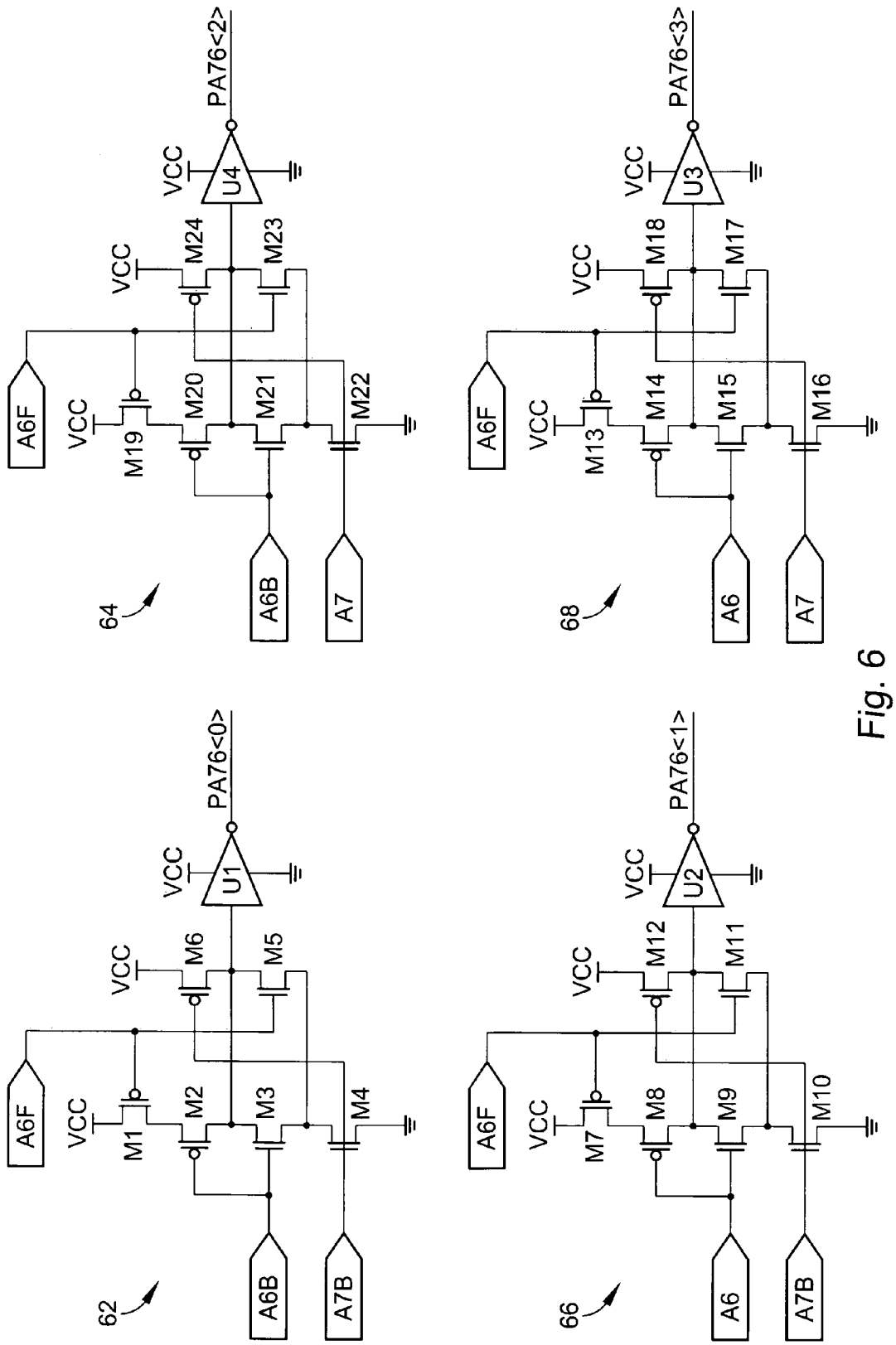
FIG. 6 is a schematic diagram of four word line predecoders according to the present invention in which the output signal is a function of two address inputs in a first operational mode, and the output signal is forced to a data state by an additional control signal input in the second operational mode.

FIG. 6 shows four address predecoders according to the present invention where an additional control signal A6F is used to enable switching between the first and second operational modes. Predecoders 62, 64, 66, and 68 include a modified NAND gate and an inverter address predecoder that makes two of the four row decoder outputs valid instead of one of four outputs valid as shown in FIG. 5. To select four word lines, both the A6 and A7 inputs are overridden by the A6F control signal so that all four outputs go valid. The modified NAND gate for predecoder 62 includes transistors M1–M6. The inverter is U1, and the address inputs are A6B and A7B. The modified NAND gate for predecoder 64 includes transistors M19–M24. The inverter is U4, and the address inputs are A6B and A7. The modified NAND gate for predecoder 66 includes transistors M7–M12. The inverter is U2, and the address inputs are A6 and A7B. The modified NAND gate for predecoder 68 includes transistors M13–M18. The inverter is U3, and the address inputs are A6 and A7.

To operate the DRAM in normal, first operational mode nothing is changed over regular operation. One wordline in a subarray will be selected to go high and connect either BL or /BL to a cell capacitor with the other BL or /BL serving as a reference BL. In the twin or multi cell second operational mode, one address is selected to be a don't care in the address buffer or row address predecoder or word line decoder circuitry so that address is a "double high" so that two row address are valid and two word lines are active. Two cell nodes are attached to a BL or /BL or two word lines are activated, one each to BL and /BL to cell nodes. Selecting word lines, one each on BL and /BL has the advantage of canceling out gate overlap coupling parasitic capacitance as commonly done with dummy word line designs.

By having twice the cell node capacitance in the second operational mode, twice the signal appears on the bit lines to sense. The refresh time can also be improved since the time the data is valid on the cell storage capacitance is increased. Refresh time is typically determined by only a few bad bits also referred to as "tail bits". Since there are only a few of these fast leakage or poor refresh bits on a typical 512M DRAM the probability of having a tail bit on both the BL and /BL bit lines when in the twin cell mode is near zero. These tail bits typically have refresh requirements that are 10 to 100 times worse than typical bits. If the major leakage mechanism is to the bit line reference, through the off memory cell pass gate to the bit line reference or precharge level, then the tail bit will go to that level quickly and the second bit of the twin cell bits will go there 10 to 100 times more slowly allowing the refresh time to improve by 10 to 100 times. If the dominant leakage is junction leakage to the substrate held at VBB or VSS then if a one is stored in the tail bit and zero is stored in the good bit then refresh time is improved by the length of time it takes the tail bit to go from VCC all the way to the substrate potential (in the twin cell mode) compared with how long it take the tail bit to go from VCC to the bit line reference (in normal mode). One estimate of the improved refresh time is roughly a factor of two. It depends, however, on the specific technology and the physical mechanism that is causing the leakage.

Figure 4:
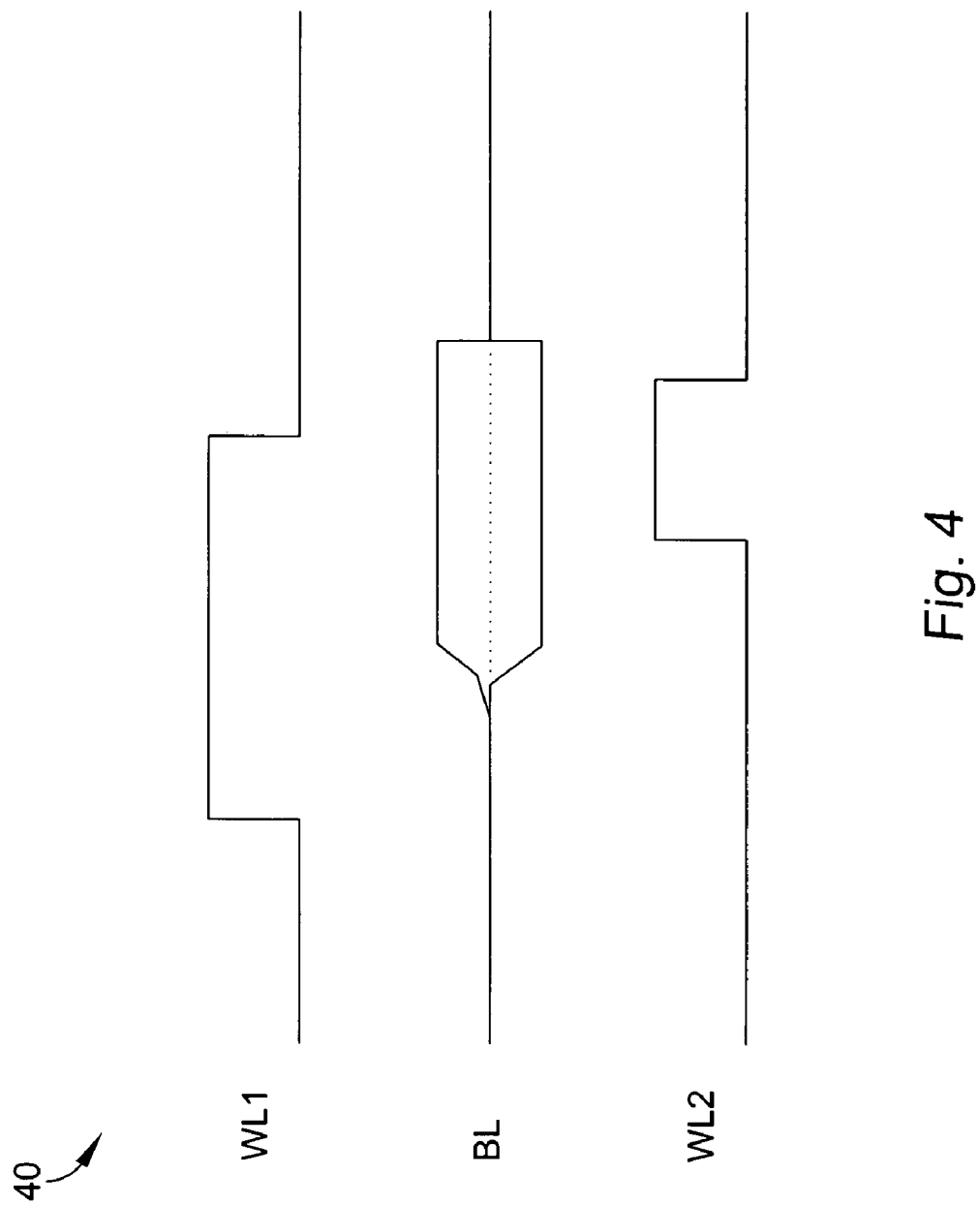
FIG. 4 is a timing diagram of a word line sequencing protocol used according to the present invention when first switching from the first operational mode to the second operational mode.

A specific word line sequencing is used to convert from the normal first operational mode to the twin or multi cell second operational mode. Referring now to the timing diagram of FIG. 4, after data is sensed and latched in normal mode (see waveforms WL1 and BL), the second word line WL2 can be brought high. This will then store complementary data, if BL and /BL cells are chosen, into the two corresponding memory cells. This allows the conversion of existing data from normal mode to twin cell mode without any extra external write cycles. After operating in the twin cell mode, or after this sequencing is done for the entire array, then both word lines are selected at the same time.

One manner of operating the circuit and method of the present invention is to operate the DRAM in normal mode during high power active read/write cycles. The twin or multi cell mode can be used after the user instructs the DRAM to go into a power savings mode such as (SRM) self refresh mode or (ZZ) sleep mode. The address bit is selected according to one of the industry standard reduced array selection bits so that since the user is planning to go from a 512M array to a 128M array, 64M array, etc, the reduced density will not impact operations in the SRM or ZZ modes.

Another way of using the circuit and method of the present invention is to screen parts at the testing operation and permanently select certain parts to stay in twin or multi cell mode to operate as "partials" (i.e. reduced density integrated circuit memories) with longer than normal refresh times. The parts can be re-branded and packaged as lower density memories.

While there have been described above the principles of the present invention in conjunction with specific components, circuitry and bias techniques, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. An integrated circuit memory comprising:
   a plurality of bit lines;
   a plurality of word lines;
   a plurality of memory cells each coupled to one of the plurality of bit lines and to one of the plurality of word lines;
   row decoder circuitry for individually activating the word lines in a first operational mode and for simultaneously activating at least two word lines in a second operational mode; and
   means for providing a word line sequence when first converting stored data in the plurality of memory cells from the first operational mode to the second operational mode.

2. The integrated circuit memory of claim 1 in which the first operational mode comprises a one memory cell per bit operational mode.

3. The integrated circuit memory of claim 1 in which the second operational mode comprises a two memory cell per bit operational mode.

4. The integrated circuit memory of claim 1 in which the second operational mode comprises a four memory cell per bit operational mode.

5. The integrated circuit memory of claim 1 in which the second operational mode comprises an eight memory cell per bit operational mode.

6. The integrated circuit memory of claim 1 in which the row decoder circuitry includes an address predecoder.

7. The integrated circuit memory of claim 6 in which the address predecoder further comprises:
   a first address input;
   a second address input;
   an output; and
   a control signal input.

8. The integrated circuit memory of claim 7 in which the output provides an output signal that is the logical combination of the data states of the first and second address inputs, and the control signal input receives a control signal for forcing the data state of the output signal.

9. The integrated circuit memory of claim 1 in which the means for providing a word line sequence comprises a means for activating a first word line, developing a valid signal on a corresponding bit line, and then activating a second word line while the first word line is still active.

10. The integrated circuit memory of claim 1 further comprising means for permanently forcing the integrated circuit memory to remain in the second operational mode.

11. A method of operating an integrated circuit memory including a plurality of bit lines, a plurality of word lines, and a plurality of memory cells each coupled to one of the plurality of bit lines and to one of the plurality of word lines, the method comprising:

individually activating the word lines in a first operational mode;

simultaneously activating at least two word lines in a second operational mode; and providing a word line sequence when first converting stored data in the plurality of memory cells from the first operational mode to the second operational mode.

12. The method of claim 11 in which individual word lines are activated to provide a one memory cell per bit operational mode in the first operational mode.

13. The method of claim 11 in which two word lines are simultaneously activated to provide a two memory cell per bit operational mode in the second operational mode.

14. The method of claim 11 in which four word lines are simultaneously activated to provide a four memory cell per bit operational mode in the second operational mode.

15. The method of claim 11 in which eight word lines are simultaneously activated to provide an eight memory cell per bit operational mode in the second operational mode.

16. The method of claim 11 in which providing a word line sequence comprises activating a first word line, developing a valid signal on a corresponding bit line, and then activating a second word line while the first word line is still active.

17. The method of claim 11 further comprising permanently forcing the integrated circuit memory to remain in the second operational mode.

18. A predecoder for an integrated circuit memory for switching between a first operational mode and a second operational mode comprising:

an input section having first and second address inputs; and an output section coupled to the input section having a control signal input and an output for providing an output signal, wherein the output signal is responsive to the data states of the first and second address inputs in the first operational mode, and the output signal is forced to a data state in response to control signal on the control signal input in the second operational mode.

19. The predecoder of claim 18 wherein the input section comprises first, second, third, and fourth cascode-coupled transistors, wherein a gate of the first transistor receives a first address signal, a gate of the second transistor receives a second address signal, a gate of the third transistor receives the second address signal, and a gate of the fourth transistor receives the control signal.

20. The predecoder of claim 18 wherein the output section comprises first and second cascode-coupled transistors, wherein a gate of the first transistor receives the control signal, and a gate of the second transistor receives a first address signal.

* * * * *